(12) United States Patent
Banine

(10) Patent No.: US 8,031,404 B2
(45) Date of Patent: Oct. 4, 2011

(54) FLY'S EYE INTEGRATOR, ILLUMINATOR, LITHOGRAPHIC APPARATUS AND METHOD

(75) Inventor: Vadim Yevgenyevich Banine, Deurne (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/605,670

(22) Filed: Oct. 26, 2009

(65) Prior Publication Data
US 2010/0103395 A1   Apr. 29, 2010

Related U.S. Application Data

(60) Provisional application No. 61/193,099, filed on Oct. 28, 2008.

(51) Int. Cl.
*G02B 27/10*   (2006.01)

(52) U.S. Cl. ........................................ 359/619; 359/620

(58) Field of Classification Search .................... 359/619
See application file for complete search history.

(56) References Cited

U.S. PATENT DOCUMENTS

| | | |
|---|---|---|
| 6,428,940 B1 | 8/2002 | Sandstrom |
| 6,438,199 B1 | 8/2002 | Schultz et al. |
| 6,498,685 B1 | 12/2002 | Johnson |
| 7,081,956 B1 | 7/2006 | Lalovic et al. |
| 7,186,983 B2 | 3/2007 | Mann et al. |
| 2003/0142409 A1* | 7/2003 | Ohtsu et al. .................. 359/619 |
| 2004/0125459 A1* | 7/2004 | Tanitsu et al. ................ 359/619 |

* cited by examiner

*Primary Examiner* — Ricky Mack
*Assistant Examiner* — James Jones
(74) *Attorney, Agent, or Firm* — Pillsbury Winthrop Shaw Pittman LLP

(57) ABSTRACT

A transmissive fly's eye integrator is disclosed that includes a first array of lenses and a second array of lenses. The first array of lenses and second array of lenses together form a fly's eye integrator, and the first array of lenses and second array of lenses comprise lenses which have a diameter selected from the range of 5 μm-50 μm, and a radius of curvature selected from the range of 25 μm-2500 μm.

20 Claims, 4 Drawing Sheets

US 8,031,404 B2

FLY'S EYE INTEGRATOR, ILLUMINATOR, LITHOGRAPHIC APPARATUS AND METHOD

This application claims priority and benefit under 35 U.S.C. §119(e) to U.S. Provisional Patent Application No. 61/193,099, entitled "Lithographic Apparatus and Method", filed on Oct. 28, 2008. The content of that application is incorporated herein in its entirety by reference.

FIELD

The present invention relates to a lithographic apparatus and method. In particular the present invention relates to a fly's eye integrator suitable for use in a lithographic apparatus or an illuminator for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use a source to provide extreme ultraviolet (EUV) radiation (sometimes termed soft x-ray). An EUV radiation source is configured to output a radiation wavelength of about 13 nm. Thus, an EUV radiation source may constitute a significant step toward achieving small features printing. Possible EUV radiation sources include, for example, a laser-produced plasma source, a discharge plasma source, or synchrotron radiation from electron storage rings.

The transmission of optical materials and of fluids generally deteriorates with decreasing wavelength. Hence EUV radiation may be substantially absorbed when traversing optical materials or fluids. A lithographic apparatus which uses EUV radiation to apply a pattern to a substrate may therefore operate under vacuum so that only a within tolerance absorption of EUV radiation may be present due to a residual, small amount of gas. A vacuum environment may be provided along a part or all of a path of the radiation beam through the lithographic apparatus with the aid of one or more vacuum walls and vacuum pumps. Since EUV radiation is readily absorbed by optical materials of refractive optical elements, there is a general tendency (i.e. a prejudice) to ensure that optical elements used to condition, pattern, direct or re-direct an EUV radiation beam in a lithographic apparatus are embodied as reflective elements, and not as refractive, transmissive elements.

In order to effectively reflect EUV radiation, reflective optical elements have to be carefully designed and constructed. Many optical elements used for reflecting BUY radiation comprise one or more layers, and are often referred to as being or comprising multilayer structures. A multilayer structure will typically reflect 65-70% of EUV radiation that is incident upon the structure. It will therefore be appreciated that the intensity of an EUV radiation beam reflected off such a multilayer structure will have its intensity reduced by 30-35% for each reflection. In a reflective EUV radiation lithographic apparatus, a radiation beam may be reflected on numerous occasions, and off numerous different optical elements, severely reducing the intensity of the radiation beam that is available to apply a pattern to a substrate. Such a reduction in intensity can have an adverse affect on the throughput of an EUV radiation lithographic apparatus. Furthermore, the need to reflect the radiation beam along a folded optical path in the lithographic apparatus may lead to an increased complexity in the design of the lithographic apparatus, and/or, for example, an increase in size or the cost of the apparatus.

SUMMARY

It is desirable, for example, to provide a lithographic apparatus and method for EUV radiation lithography wherein the losses in intensity of the radiation referred to above, and/or the increased complexity of the apparatus referred to above, are obviated or mitigated.

According to an embodiment of the invention, there is provided a transmissive fly's eye integrator comprising: a first array of lenses; and a second array of lenses, wherein the first array of lenses and second array of lenses together form a fly's eye integrator, and the first array of lenses and second array of lenses comprise lenses which have a diameter selected from the range of 5 µm-50 µm, and a radius of curvature selected from the range of 25 µm-2500 µm.

The lenses may comprise (e.g. be formed from) at least one material selected from the following materials: Si, Y, Be, Mo, B, Ru, Cr, Sc, Al, Ni, or a carbide, an oxide, or a nitride of any of those materials, or a polymer.

The fly's eye integrator may be suitable for use in a lithographic apparatus. The lithographic apparatus may be configured to use radiation having a wavelength in, or shorter than, a range defining the EUV part of the electromagnetic spectrum to apply a pattern to a substrate.

According to an embodiment of the present invention, there is provided an illuminator for a lithographic apparatus, the illuminator comprising a fly's eye integrator as described herein.

According to an embodiment of the present invention, there is provided a lithographic apparatus comprising a fly's eye integrator as described herein or comprising the illuminator comprising a fly's eye integrator as described herein.

The lithographic apparatus may be configured to use radiation, having a wavelength selected from the range of 5 nm to 20 nm, to apply a pattern to a substrate.

According to an embodiment of the present invention, there is provided a method of improving the uniformity of a radiation beam, the method comprising: passing the radiation beam through a transmissive fly's eye integrator, the fly's eye integrator comprising: a first array of lenses; and a second array of lenses, wherein the first array of lenses and second array of lenses together form a fly's eye integrator, and the first array of lenses and second array of lenses comprise lenses which have a diameter selected from the range of 5 µm-50 µm, and a radius of curvature selected from the range of 25 µm-2500 µm.

The radiation beam may comprise radiation having a wavelength that is selected from the range of 5 mm to 20 nm.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
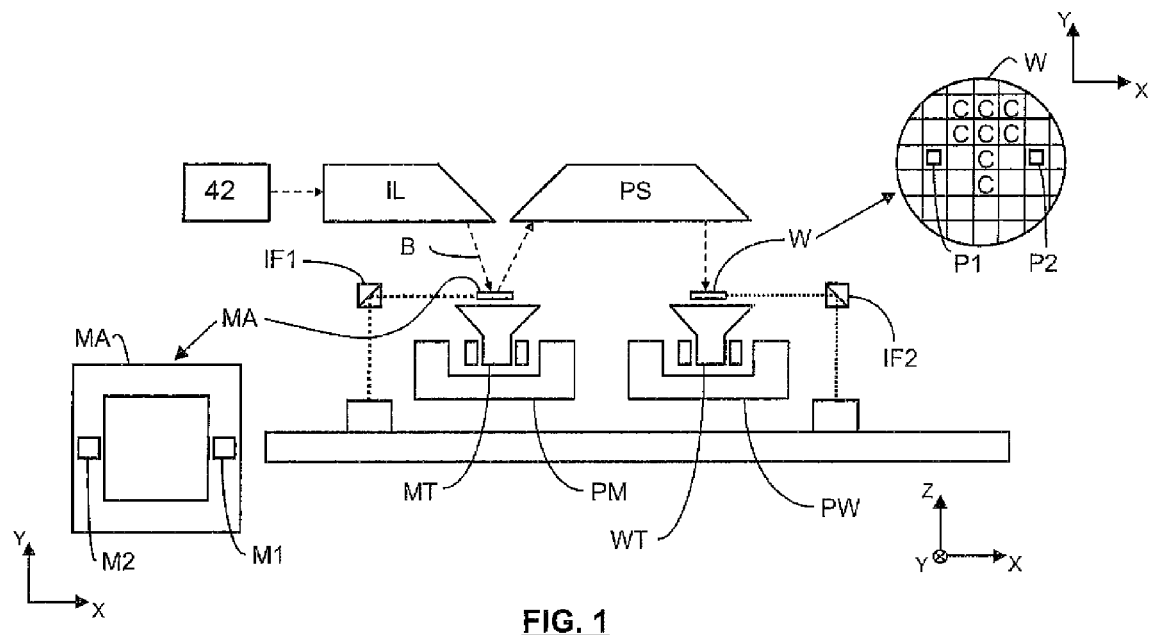
FIG. 1 schematically depicts a lithographic apparatus according to an embodiment related to the invention.

FIG. 1 schematically depicts a lithographic apparatus according to an embodiment related to the invention. The apparatus comprises:

- an illumination system (illuminator) IL configured to condition a radiation beam B (e.g. EUV radiation);
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of one or more vacuum walls and one or more vacuum pumps.

As here depicted, the apparatus is of a reflective type (e.g. employing a reflective mask). Alternatively, the apparatus may be of a transmissive type (e.g. employing a transmissive mask). EUV radiation is readily absorbed by optical materials or refractive optical elements. For this reason, it is generally considered that a lithographic apparatus that uses EUV radiation to apply patterns to a substrate should be reflective in nature, and not transmissive.

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source 42. The source and the lithographic apparatus may be separate entities, for example when the source is an excimer laser. In such cases, the source is not considered to form part of the lithographic apparatus and the radiation beam is passed from the source 42 to the illuminator IL with the aid of a beam delivery system BD comprising, for example, suitable directing mirrors and/or a beam expander. In other cases the source 42 may be an integral part of the lithographic apparatus, for example when the source is a mercury lamp. The source 42 and the illuminator IL, together with the beam delivery system BD if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
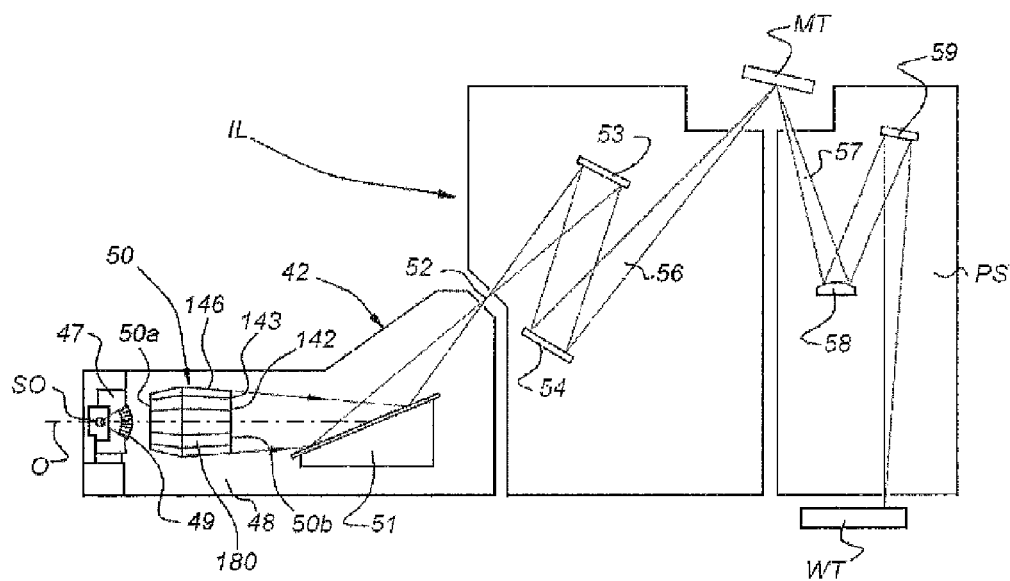
FIG. 2 schematically depicts a more detailed representation of the lithographic apparatus shown in and described with reference to FIG. 1.

FIG. 2 shows the lithographic apparatus in more detail, including a radiation source 42, the illumination system IL, and the projection system PS. The radiation source 42 includes the radiation emission point SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma of an electrical discharge to collapse onto an optical axis O. Partial pressures of, for example, 10 Pa of Xe, Li, Sn vapor or any other suitable gas or vapor may be required for efficient generation of the radiation. In an embodiment, a Sn based radiation source is applied as an EUV radiation source. The radiation emitted by radiation emission point SO is passed from a source chamber 47 into a collector chamber 48 via an optional gas barrier or contaminant trap 49 (in some cases also referred to as contaminant barrier or foil trap) which is positioned in or behind an opening in source chamber 47. The contaminant trap 49 may include a channel structure. Contaminant trap 49 may also include a gas barrier or a combination of a gas barrier and a channel structure.

The collector chamber 48 may include a radiation collector 50 which may be a so-called grazing incidence collector (including a so-called grazing incidence reflector). Radiation collector 50 has an upstream radiation collector side 50a and a downstream radiation collector side 50b. Radiation passed by collector 50 can be reflected off a grating spectral filter 51 to be focused in an intermediate focus point 52 at an aperture in the collector chamber 48. The beam of radiation emanating from collector chamber 48 traverses the illumination system IL via so-called normal incidence reflectors 53, 54, as indicated by the beam of radiation 56 in FIG. 2. These normal-incidence reflectors direct the beam 56 onto a patterning device (e.g. reticle or mask) positioned on a support (e.g. reticle or mask table) MT. A patterned beam 57 is formed, which is imaged by projection system PS via reflective elements 58, 59 onto substrate table WT. More elements than shown may generally be present in illumination system IL and/or projection system PS. Grating spectral filter 51 may optionally be present, depending upon the type of lithographic apparatus. Further, there may be more mirrors present than those shown in the Figures, for example there may be 1-4 more reflective elements present than the elements 58, 59 shown in the projection system PS of FIG. 2.

In an embodiment, radiation collector 50 is a nested collector with reflectors 142, 143, and 146. The nested radiation collector 50, as schematically depicted in FIG. 2, is hereinafter used as an example of a grazing incidence collector (or grazing incidence collector reflector). However, instead of radiation collector 50 including a grazing incidence reflector, a radiation collector including a normal incidence reflector may be applied. Hence, where applicable, radiation collector 50 as a grazing incidence collector may also be interpreted as a collector in general, and in a specific embodiment also as a normal incidence collector.

Further, instead of a grating 51, as schematically depicted in FIG. 2, a transmissive optical filter may be applied. An optical filter transmissive for EUV radiation and less transmissive for, or even substantially absorbing of, ultraviolet (UV) radiation are known in the art. Hence, "grating spectral filter" is herein further indicated as a "spectral filter" which includes a grating or transmissive filter and the like. Not depicted in schematic FIG. 2, but also included as optional optical element may be one or more EUV radiation transmissive optical filters, for instance arranged upstream of radiation collector 50, or one or more EUV radiation transmissive optical filters in illuminator IL and/or projection system PS.

The radiation collector 50 is usually placed in the vicinity of the radiation emission point SO or an image of the radiation emission point SO. Each reflector 142, 143, 146 may include at least two adjacent reflecting surfaces, a reflecting surface further from the radiation emission point SO being placed at a smaller angle to the optical axis O than the reflecting surface that is closer to the radiation emission point SO. In this way, the radiation collector 50 is configured to generate a beam of (E)UV radiation propagating along the optical axis O. At least two reflectors may be placed substantially coaxially and extend substantially rotationally symmetrically about the optical axis O. It should be appreciated that radiation collector 50 may have further features on the external surface of outer reflector 146 or further features around outer reflector 146. For example, a further feature may be a protective holder, or a heater. Reference number 180 indicates a space between two reflectors, e.g., between reflectors 142 and 143.

During use, on one or more of the outer reflectors 146 and inner reflectors 142 and 143, deposition may be found. The radiation collector 50 may be deteriorated by such deposition (deterioration by debris, e.g. ions, electrons, clusters, droplets, electrode corrosion from the radiation emission point SO). Deposition of Sn, for example due to a Sn source, may, after a few mono-layers, be detrimental to reflection of the radiation collector 50 or other optical elements, which may necessitate the cleaning of such optical elements.

It will be appreciated from the descriptions of FIGS. 1 and 2 that multiple reflections of an EUV radiation beam of radiation are required to condition, shape, and pattern the EUV radiation beam, and also direct the radiation beam from its source to the substrate. Optical elements (e.g. mirrors and the like) used to reflect EUV radiation are often formed from, for example, a multilayer structure. A typical multilayer structure will, for appropriate angles of incidence, reflect 65-70% of EUV radiation that is incident upon the structure. Thus it will be appreciated that for multiple reflections within an EUV radiation lithographic apparatus, the intensity of an EUV beam of radiation will be severely reduced from its initial intensity at the source to its final (useable) intensity on a target portion of the substrate. Furthermore, and as will be appreciated from FIG. 2 and its description, the multiple reflections required to direct the EUV radiation beam from the source to the substrate requires an often elaborate arrangement of reflective optical elements. Such elements may be used to fold, manipulate, control, etc., the path of the EUV radiation beam. The optical elements are arranged such that the path of the EUV radiation beam is not inadvertently blocked or obstructed by, for example, one or more of such optical elements or other parts of the lithographic apparatus. An elaborate and carefully designed arrangement of such optical elements may lead to complexity in the design of the EUV radiation lithographic apparatus, and/or an increase in the size or cost of the apparatus.

According to an embodiment of the present invention, one or more of the above-mentioned problems or other problems not mentioned herein can be at least partially overcome by using one or more transmissive optical elements in the EUV radiation lithographic apparatus. There is a general prejudice in EUV radiation lithography against the use of transmissive optical elements, since it is generally taken to be understood that such transmissive optical elements will absorb too much EUV radiation to be of any practical use. Surprisingly, however, according to an embodiment of the present invention, a transmissive optical element having certain dimensions is substantially transmissive to EUV radiation that is to be used in an EUV radiation lithographic apparatus. Furthermore, the transmittance of such a transmissive optical element may, in some embodiments, be greater than the reflectance of reflective optical elements which are commonly used in an EUV radiation lithographic apparatus.

In an embodiment of the present invention, a transmissive optical element for use in an EUV radiation lithographic apparatus (for example, in an illuminator of or for an BUY radiation lithographic apparatus) is a fly's eye integrator comprising two arrays of lenses. Fly's eye integrators are known in the art, and so specific details of their optical properties and configurations will not be described in detail here. For the purposes of embodiments of the present invention, lenses forming the arrays of lenses will have a diameter selected from the range of 5 μm-50 μm (for example, 10 μm) and a radius of curvature of selected from the range of 25 μm-2500 μm. For example, lenses forming the arrays of lenses may have a diameter of 10 μm and a radius of curvature of 100 μm. For a typical lens diameter of 10 μm and a radius of curvature of 100 μm, the lens thickness may be of the order of 100 nm. Lenses with a diameter-radius combination defined by diameter of 5 μm and radius of curvature of 25 μm, or diameter of 10 μm and radius of curvature of 100 μm, or diameter of 20 μm and radius of curvature of 400 μm, or diameter of 50 μm and radius of curvature of 2500 μm, may all have a lens thickness of the order of 100 nm.

A lens having a diameter and radius of curvature in the ranges specified above or with a diameter-radius combination specified above have a sufficient transmittance with respect to EUV radiation (or radiation of a shorter wavelength) to be useable in an EUV radiation (or shorter wavelength) lithographic apparatus. This is especially the case if the lens is formed from Si, Y, Be, Mo, B, Ru, Cr, Sc, Al, Ni, a carbide, an oxide or a nitride of any of those elements, a polymer, or any appropriate combination of the foregoing. For instance, an array of lenses having lenses that are made from silicon, having a diameter of about 10 μm and having a radius of curvature of about 100 μm, will have a transmission of about 85% for EUV radiation. This is a significant improvement over the 65-70% reflectance of a multilayer structure used in conventional reflective optical elements in an EUV radiation lithographic apparatus.

Specific embodiments of the present invention will now be described with reference to FIGS. 3, 4, 5, 6a and 6b, together with reference to and comparisons with a prior art arrangement.

Figure 3:
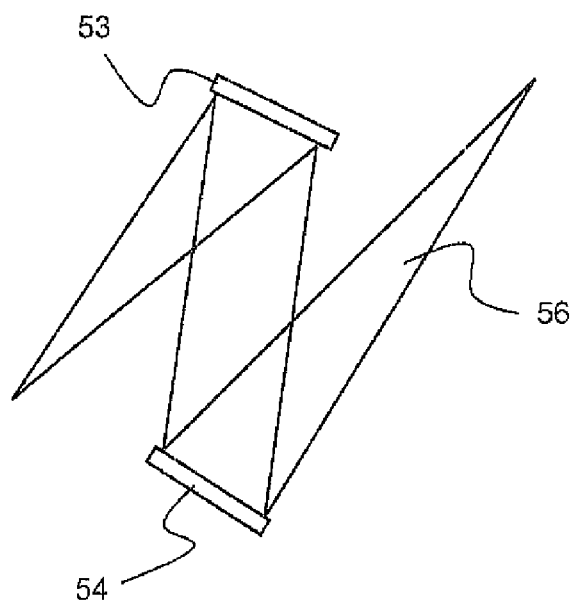
FIG. 3 schematically depicts a part of the illuminator shown in and described with reference to FIGS. 1 and 2.

FIG. 3 schematically depicts a part of the illuminator IL shown in and described with reference to FIG. 2. The part of the illuminator shown comprises normal incidence reflectors 53, 54. A beam of radiation 56 is reflected off both normal incidence reflectors 53, 54, as described above in relation to FIG. 2. Referring back to FIG. 3, the radiation beam 56 may be reflected off the normal incidence reflectors 53, 54 to improve the uniformity of the radiation beam 56. In other words, the normal incidence reflectors 53, 54 may serve as an optical integrator. For example, the reflector 53 may include a plurality of reflective field facet elements and the reflector 54 may include a corresponding plurality of pupil facet mirrors. Each pair of field facet mirror and pupil facet mirror is constructed and arranged such that the field facet mirror images the intermediate focus 52 onto the pupil facet mirror, and the pupil facet mirror images an intensity distribution at the field facet mirror on the patterning device MT. As a result the images of the intermediate focus at the pupil facet mirrors of element 54 may serve as a secondary source of EUV radiation, whilst the intensity distribution at the patterning device MT is a homogenized mixture of intensity distribution images as projected by the pupil facet mirrors.

The normal incidence reflectors 53, 54 are formed from a multilayer structure, as is known in the art. The multilayer structure results in the normal incidence reflectors 53, 54 having a reflectance of 65-70% for BUY radiation that is incident upon the reflectors 53, 54. Thus, for the beam path shown in FIG. 3, where the radiation beam 56 is reflected off both normal incident reflectors 53, 54, the intensity of the radiation beam will be reduced by between about 44% and 58%. Thus, as a result, the intensity of the EUV radiation beam 56 will be almost halved due to being reflected off the normal incidence collectors 53, 54. In order to maximize throughput of an EUV radiation lithographic apparatus, it is desirable to minimize the reduction in the intensity of an EUV radiation beam as it passes through the lithographic apparatus in order to ensure that as much radiation as possible is available for applying a pattern to a substrate. Furthermore, it can be seen from FIG. 3 that, because the radiation beam 56 is reflected, the beam path of the radiation beam 56 is folded. The folding of the radiation beam path, and the position of the optical elements used to fold the radiation beam must be configured to ensure that the radiation beam is not inadvertently obstructed by one or more parts of the lithographic apparatus. This can lead to an increase in the complexity of the design of the lithographic apparatus, and/or an increase in the size or cost of the apparatus.

Figure 4:
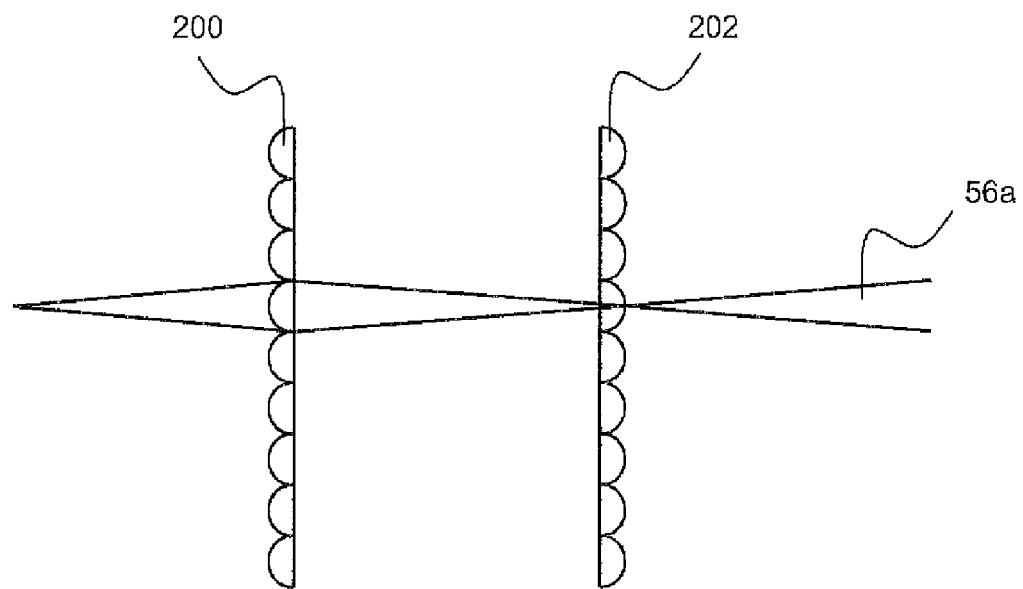
FIG. 4 schematically depicts a part of an illuminator in accordance with an embodiment of the present invention.

FIG. 4 schematically depicts a fly's eye integrator in accordance with an embodiment of the present invention. The fly's eye integrator may be used instead of, or as well as, the integrator formed by the normal incidence reflectors 53, 54 shown in and described with reference to FIGS. 2 and 3. That is, the fly's eye integrator of FIG. 4 may be used in an illuminator of a lithographic apparatus. The fly's eye integrator of FIG. 4 may in addition or alternatively be used in one or more other parts of the lithographic apparatus.

The fly's eye integrator comprises a first array of lenses 200 and a second array of lenses 202. A radiation beam 56a is passed through the first and second arrays of lenses 200, 202 of the fly's eye integrator in order to improve the uniformity of the radiation beam. In order for the first and second arrays of lenses 200, 202 to serve as a fly's eye integrator, each lens of the first array of lenses 200 may be configured to form an image of the radiation emission point at an exit surface of a respective lens of the second array of lenses 202. For example, each lens of the first array of lenses 200 may be configured to form an image of the intermediate focus 52 at or near an exit surface of a respective lens of the second array of lenses 202. The second array of lenses may be located in, at or adjacent to a pupil plane of the illuminator (or of the lithographic apparatus in general). Lenses of the first array of lenses 200 may be considered to function as field facets or lenses, while lenses of the second array of lenses 202 may be considered to function as pupil facets or lenses (in analogy with the field facet mirrors and pupil facet mirrors mentioned above). Fly's eye integrators are well known in the art, and so their configuration will not be described in more detail here. The benefit and advantage of an embodiment of the present invention are associated with the transmissive nature of the fly's eye integrator with respect to EUV radiation, which is described in more detail below.

If each of the lenses of the arrays 200, 202 are formed from silicon, have a diameter of about 10 μm and a radius of curvature of about 100 μm, the transmission of each lens with respect to EUV radiation will be approximately 85%. It can be seen from FIG. 4 that each part of the radiation beam 56a will have to pass through two lenses, a lens in the first array of lenses 200 and a lens in the second array of lenses 202. The overall transmission of the fly's eye integrator is the total transmittance for the two arrays of lenses 200, 202 combined. The transmittance is thus approximately 72% for the fly's eye integrator as a whole. In other words, the intensity of a radiation beam passing through the fly's eye integrator of FIG. 4 will be reduced by approximately 28%. This is in stark contrast with, and a significant improvement on the situation shown in and described with reference to FIG. 3, where the reduction in intensity of an EUV radiation beam reflected off two normal incidence reflectors was described as being approximately 50%.

Figure 5:
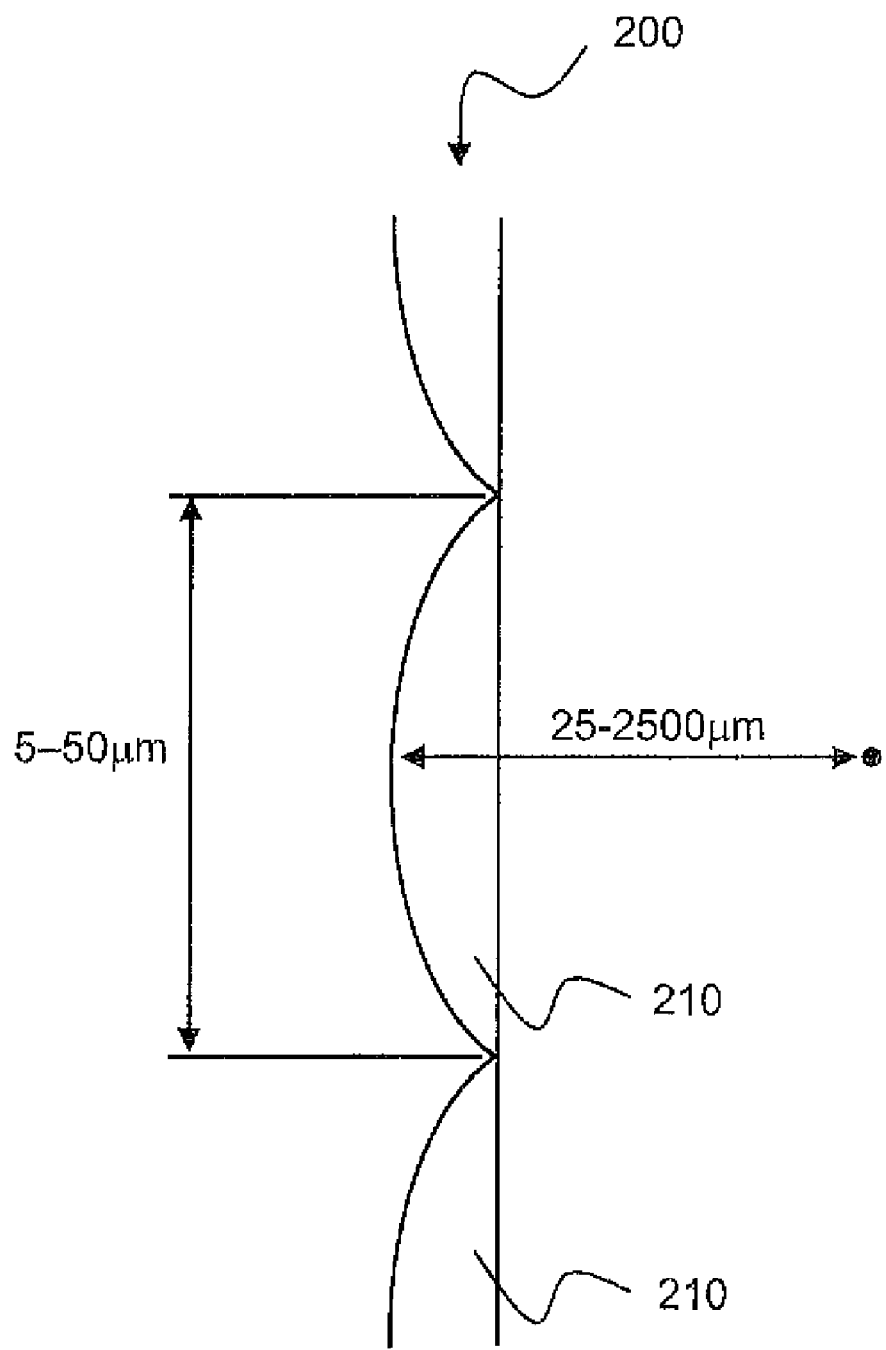
FIG. 5 is a more detailed view of a section of the part of the illuminator shown in and described with reference to FIG. 4.

FIG. 5 is a more detailed and expanded view of a part of the first array of lenses 200 forming part of the fly's eye integrator shown in and described with reference to FIG. 4. FIG. 5 shows a plurality of lenses 210 forming a part of the first array of lenses 200. In order to be substantially transmissive to EUV radiation (e.g. having a transmission of about 80% or more), each lens 210 in the array 200 should have a diameter selected from the range of 5 μm-50 μm, for example 10 μm. The radius of curvature of each lens 210 should be selected from the range of 25 μm-2500 μm, the range of 50 μm-400 μm, or the range of 90 μm-110 μm, for example 100 μm. The lenses 210 may be formed from any suitable material which is substantially transmissive to EUV radiation.

For example, for EUV radiation having a wavelength at or around 13.5 nm, materials such as Si, Y, Be, Mo, B, Ru, or a carbide, oxide or nitride of any of those elements, may be suitable. For EUV radiation and/or shorter wavelengths, Cr, Sc, Al, Ni or a carbide, oxide or nitride of any of those elements, may be suitable. A polymer material may be suitable for EUV radiation and/or shorter wavelengths. Silicon may be a desirable material, since silicon can be relatively easily worked with using, for example, optical and/or imprint lithography processes to form lenses of the specified dimensions herein. Lens arrays formed from one or more other material may also or instead be formed using, for example, optical and/or imprint lithography processes.

Figure 6A:
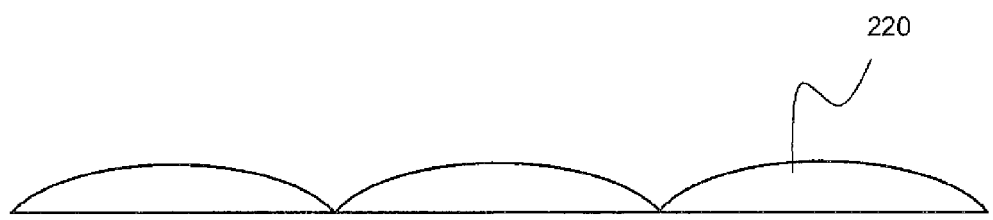
FIGS. 6*a* and 6*b* schematically depict embodiments of arrays of lenses that may be used in accordance with an embodiment of the present invention.
Figure 6B:
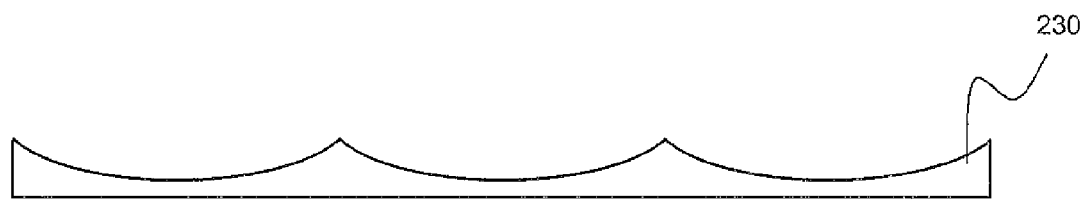

In the embodiments described above, the lenses forming the arrays of lenses have been shown in the Figures as being convex lenses. Depending on the configuration and required setup of the fly's eye arrangement, the lenses could alternatively be concave in shape. FIG. 6a schematically shows an array of convex lenses 220 that may be used to form one or more arrays of lenses of a fly's eye integrator according to an embodiment of the present invention. FIG. 6b shows an array of concave lenses 230 that may be used to form one or more arrays of lenses of a fly's eye integrator according to an embodiment of the present invention. It will be appreciated that the diameters and radii of curvatures of the convex or concave lenses may be specifically chosen to help ensure that the lenses of the arrays have appropriate and desired imaginary or real focal lengths, as is known in the art.

An advantage of using a fly's eye arrangement as described in relation to FIGS. 4 and 5 is the decrease in the loss of intensity of an EUV radiation beam passing through the fly's eye integrator when compared with existing reflective integrators. Because the fly's eye integrator according to an embodiment of the present invention is transmissive, another advantage is that there does not need to be any folding of the path of the radiation beam. This makes the beam path simpler, and allows apparatus in which the fly's eye arrangement is located to be smaller and less complex in comparison with, for example, an illuminator using a reflective integrator.

The described fly's eye integrator may be used in a lithographic apparatus. The described fly's eye integrator may be used in an illuminator of or for a lithographic apparatus. The lithographic apparatus may be, for example, a stepper or a scanner lithographic apparatus. The field size of the lithographic apparatus is desirably greater than 1 mm×1 mm, for example 15 mm×15 mm, or 26 mm×33 mm. Each lens of the first array of lenses of the fly's eye integrator may be positioned to correspond with a position of a corresponding lens of the second array of lenses of the fly's eye integrator. The spatial distribution of lenses in the first array of lenses may be similar or identical to the spatial distribution of lenses in the second array of lenses. The diameters and/or radii of curvature of the lenses of the first array may be substantially the same. The diameters and/or radii of curvature of the lenses of the second array may be substantially the same. The diameters and/or radii of curvature of the lenses of the first array may be substantially the same as the diameters and/or radii of curvature of the lenses of the second array. One or more lenses of the first array and/or the second array may have a different diameter and/or radii of curvature than one or more other lenses of the first array and/or the second array.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

The terms "radiation" and "beam" used herein encompass all types of electromagnetic radiation, including ultraviolet (UV) radiation (e.g. having a wavelength of or about 365, 355, 248, 193, 157 or 126 nm) and EUV radiation (e.g. having a wavelength in the range of 2-20 nm).

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A transmissive fly's eye integrator comprising:
a first array of lenses; and
a second array of lenses,
wherein the first array of lenses and second array of lenses together form a fly's eye integrator, and the first array of lenses and second array of lenses comprise lenses which have a diameter and a radius of curvature combination selected from the group consisting of: diameter of 5 µm and radius of curvature of 25 µm; diameter of 10 µm and radius of curvature of 100 µm; diameter of 20 µm and radius of curvature of 400 µm; and diameter of 50 µm and radius of curvature of 2500 µm.

2. The transmissive fly's eye integrator of claim 1, wherein the lenses have the diameter-radius combination of diameter of 5 µm and radius of curvature of 25 µm.

3. The transmissive fly's eye integrator of claim 1, wherein the lenses have the diameter-radius combination of diameter of 10 µm and radius of curvature of 100 µm.

4. The transmissive fly's eye integrator of claim 1, wherein the lenses have the diameter-radius combination of diameter of 20 µm and radius of curvature of 400 µm.

5. The transmissive fly's eye integrator of claim 1, wherein the lenses have the diameter-radius combination of diameter of 50 µm and radius of curvature of 2500 µm.

6. The transmissive fly's eye integrator of claim 1, wherein the lenses comprise at least one material selected from the following materials: Si, Y, Be, Mo, B, Ru, Cr, Sc, Al, Ni, or a carbide, an oxide, or a nitride of any of those materials, or a polymer.

7. An illuminator for a lithographic apparatus, the illuminator comprising the fly's eye integrator of claim 1.

8. The illuminator of claim 7, configured to use radiation, having a wavelength selected from the range of 5 nm-20 nm, to apply a pattern to a substrate.

9. A lithographic apparatus comprising the illuminator of claim 7.

10. The lithographic apparatus of claim 9, configured to use radiation, having a wavelength selected from the range of 5 nm-20 nm, to apply a pattern to a substrate.

11. A lithographic apparatus comprising the fly's eye integrator of claim 1.

12. The lithographic apparatus of claim 11, configured to use radiation, having a wavelength selected from the range of 5 nm-20 nm, to apply a pattern to a substrate.

13. A method of improving the uniformity of a radiation beam, the method comprising:
passing the radiation beam through a transmissive fly's eye integrator, the fly's eye integrator comprising:
a first array of lenses; and
a second array of lenses,
wherein the first array of lenses and second array of lenses together form a fly's eye integrator, and the first array of lenses and second array of lenses comprise lenses which have a diameter and a radius of curvature combination selected from the group consisting of: diameter of 5 µm and radius of curvature of 25 µm; diameter of 10 µm and radius of curvature of 100 µm; diameter of 20 µm and radius of curvature of 400 µm; and diameter of 50 µm and radius of curvature of 2500 µm.

14. The method of claim 13, wherein the lenses have the diameter-radius combination of diameter of 5 µm and radius of curvature of 25 µm.

15. The method of claim 13, wherein the lenses have the diameter-radius combination of diameter of 10 µm and radius of curvature of 100 µm.

16. The method of claim 13, wherein the lenses have the diameter-radius combination of diameter of 20 µm and radius of curvature of 400 µm.

17. The method of claim 13, wherein the lenses have the diameter-radius combination of diameter of 50 µm and radius of curvature of 2500 µm.

18. The method of claim 13, wherein the lenses comprise at least one material selected from the following materials: Si, Y, Be, Mo, B, Ru, Cr, Sc, Al, Ni, or a carbide, an oxide, or a nitride of any of those materials, or a polymer.

19. The method of claim 13, wherein the radiation beam comprises radiation having a wavelength selected from the range of 5 nm-20 nm.

20. A transmissive fly's eye integrator comprising:
a first array of lenses; and
a second array of lenses,
wherein the first array of lenses and second array of lenses together form a fly's eye integrator, and the first array of lenses and second array of lenses comprise lenses which have a diameter selected from the range of 5 µm-50 µm, have a radius of curvature selected from the range of 25 µm-2500 µm, and have a diameter-radius of curvature ratio selected from the group consisting of: 1:5, 1:10, 1:20, and 1:50.

* * * * *